United States Patent [19]
Frater

[11] Patent Number: 6,130,000
[45] Date of Patent: Oct. 10, 2000

[54] COPPER AND STEEL COMPONENTS FOR USE IN MANUFACTURING PRINTED CIRCUIT BOARDS

[75] Inventor: Mark S. Frater, Stockton, Calif.

[73] Assignee: R. E. Service Company, Inc., Lodi, Calif.

[21] Appl. No.: 09/210,349

[22] Filed: Dec. 11, 1998

Related U.S. Application Data

[63] Continuation-in-part of application No. 09/058,262, Apr. 10, 1998, which is a continuation-in-part of application No. 09/182,956, Oct. 29, 1998, which is a continuation-in-part of application No. 09/193,461, Nov. 17, 1998.

[51] Int. Cl.[7] .................................................. B32B 33/00
[52] U.S. Cl. ......................... 428/687; 29/830; 156/233; 156/288; 174/255; 174/256; 428/606; 428/607; 428/612
[58] Field of Search ................................... 428/687, 606, 428/607, 612; 174/255, 256; 156/233, 288; 29/830

[56] References Cited

U.S. PATENT DOCUMENTS

| | | |
|---|---|---|
| Re. 29,820 | 10/1978 | Konicek . |
| 2,688,348 | 9/1954 | Sullivan . |
| 2,706,165 | 4/1955 | Korsgaard . |
| 3,589,975 | 6/1971 | Andrews et al. . |
| 3,592,722 | 7/1971 | Morgan . |
| 3,647,592 | 3/1972 | Woodberry . |
| 3,730,825 | 5/1973 | Nakane . |

(List continued on next page.)

FOREIGN PATENT DOCUMENTS

| | | |
|---|---|---|
| 0 212 124 | 3/1987 | European Pat. Off. . |
| 0 235 582 | 9/1987 | European Pat. Off. . |
| 299 454 | 1/1989 | European Pat. Off. . |
| 0 411 142 | 2/1991 | European Pat. Off. . |
| 0 872 301 | 10/1998 | European Pat. Off. . |
| 28 43 263 | 2/1980 | Germany . |
| 31 31 688 | 5/1982 | Germany . |
| 41 16 543 | 11/1992 | Germany . |
| 297 19 716 | 12/1997 | Germany . |
| 52-5353 | 2/1977 | Japan . |
| 62-208915 | 9/1987 | Japan . |
| 2-58885 | 2/1990 | Japan . |
| 2-291191 | 11/1990 | Japan . |
| 2-310041 | 12/1990 | Japan . |
| 4-186798 | 7/1992 | Japan . |
| 1 217 104 | 12/1970 | United Kingdom . |

OTHER PUBLICATIONS

Pohl, et al., "Producing and Jointly Processing Base Laminates for Multilayer Printed Circuit Cards", IBM Technical Disclosure Bulletin, vol. 27, No. 8, Jan. 1985, pp. 4841–4842.

Declaration of Robert Jordan, United States District Court, Northern District of California, San Jose Division, Case No. C92 20672 JW (PVT), Nov. 25, 1992.

Declaration of Glynn Shaw, United States District Court, Northern District of California, San Jose Division, Case No. C92 20672 JW (PVT), Nov. 30, 1992.

Declaration of Alan Gishi, United States District Court, Northern District of California, San Jose Division, Case No. C92 20672 JW (PVT), Dec. 7, 1992.

Memorandum to the Assistant Comissioner of Patents, Response to Petition for Public Use Proceeding Under 37 CFR 1.292, Ser. No. 07/955,121, United States and Trademark Office, Dec. 8, 1994, pp. 3–4.

Examiner's Action, Ser No. 07/955,121 United States Patent and Trademark Office, Jul. 11, 1996, pp. 7–8.

Hinton, P., "The High–Yield Challenge in Laminating MLBs", Electronic Packaging and Production, vol. 30, No. 1, pp. 56–61, Jan. 1990.

Primary Examiner—Deborah Jones
Assistant Examiner—Robert R. Koehler
Attorney, Agent, or Firm—John P. O'Banion

[57] ABSTRACT

A corrosion resistant sheet alloy separator sheet for use in a press lay-up between printed circuit board panels.

9 Claims, 4 Drawing Sheets

U.S. PATENT DOCUMENTS

| | | |
|---|---|---|
| 3,808,088 | 4/1974 | Knechtges et al. . |
| 3,932,250 | 1/1976 | Sato et al. . |
| 3,936,548 | 2/1976 | Konicek . |
| 3,948,701 | 4/1976 | Fasbender et al. . |
| 3,984,598 | 10/1976 | Sarazin et al. . |
| 3,990,926 | 11/1976 | Konicek . |
| 4,022,648 | 5/1977 | Woodberry et al. . |
| 4,023,998 | 5/1977 | Cederberg et al. . |
| 4,092,925 | 6/1978 | Fromson . |
| 4,113,576 | 9/1978 | Hutkin . |
| 4,179,324 | 12/1979 | Kirkpatrick . |
| 4,180,608 | 12/1979 | Del . |
| 4,351,873 | 9/1982 | Davis . |
| 4,357,395 | 11/1982 | Lifshin et al. . |
| 4,381,327 | 4/1983 | Briere . |
| 4,383,003 | 5/1983 | Lifshin et al. . |
| 4,394,419 | 7/1983 | Konicek . |
| 4,446,188 | 5/1984 | Patel et al. . |
| 4,455,181 | 6/1984 | Lifshin et al. . |
| 4,568,413 | 2/1986 | Toth et al. . |
| 4,587,152 | 5/1986 | Gleichenhagen et al. . |
| 4,715,116 | 12/1987 | Thorpe et al. . |
| 4,722,765 | 2/1988 | Ambros et al. . |
| 4,775,599 | 10/1988 | Matsuoka et al. ............ 428/687 |
| 4,781,969 | 11/1988 | Kobayashi et al. . |
| 4,788,102 | 11/1988 | Koning et al. . |
| 4,847,146 | 7/1989 | Yeh et al. . |
| 4,872,934 | 10/1989 | Kameda . |
| 4,875,283 | 10/1989 | Johnston . |
| 4,961,806 | 10/1990 | Gerrie et al. . |
| 5,030,302 | 7/1991 | Jud et al. . |
| 5,057,372 | 10/1991 | Imfeld et al. . |
| 5,096,522 | 3/1992 | Kawachi et al. . |
| 5,120,590 | 6/1992 | Savage et al. . |
| 5,153,050 | 10/1992 | Johnston . |
| 5,350,621 | 9/1994 | Yuhas et al. . |
| 5,407,744 | 4/1995 | Herrero et al. ............ 428/606 |
| 5,512,381 | 4/1996 | Konicek et al. . |
| 5,674,596 | 10/1997 | Johnston . |
| 5,716,168 | 2/1998 | Janoff . |
| 5,725,937 | 3/1998 | Johnston . |
| 5,789,066 | 8/1998 | De Mare et al. ............ 428/612 |

6,130,000

COPPER AND STEEL COMPONENTS FOR USE IN MANUFACTURING PRINTED CIRCUIT BOARDS

CROSS-REFERENCE TO RELATED APPLICATIONS

This application is a continuation-in-part of application Ser. No. 09/058,262 filed on Apr. 10, 1998, now allowed a continuation-in-part of application Ser. No. 09/182,956 filed on Oct. 29, 1998, now allowed and a continuation-in-part of application Ser. No. 09/193,461 filed on Nov. 17, 1998, now allowed.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

This invention pertains generally to circuit board fabrication, and more particularly to copper and steel components for use in the manufacture of printed circuit boards.

2. Description of the Background Art

In early stages of manufacturing technology, printed circuit board (PCB) lay-up panels were laminated using presses similar to those used in the wood industry for laminating, for example, sheets of plywood. Hydraulic-driven presses were used, and steam or electric power was used to heat the presses to temperatures exceeding 350° F. The panel components in the presses were submitted to pressures between 300 psi and 500 psi at 350° F. for approximately one hour to achieve lamination. A typical multilayer layup configuration 10 of two PCB panels 12a, 12b in a press opening is schematically shown in FIG. 1. A highly polished and precision ground stainless steel plate 14 approximately 0.062 inches thick was used to separate each panel 12a, 12b within the press opening, and like 0.062 inch stainless steel plates 16a, 16b were placed on the top and bottom of the stack, respectively. In the layup, a first thin copper layer 18a would be placed on the separator sheet 16a with its working surface facing the separator sheet. A laminated multilayer core 20a would be placed over copper layer 18a. While core 20a is shown as a single layer for simplicity, core 20a would typically comprise a multilayer assembly of a plurality of plys of prepreg, a plurality of double sided boards, and conductive paths between the boards. A second thin copper layer 18b would be placed over core 20a, with its working surface facing away from the core. Stainless steel separator plate 14 would then be placed over copper layer 18b, and a second book, comprising an identical arrangement of a core 20b between copper layers 22a, 22b would be layed up on separator plate 14.

Typically, a T-304 full hard alloy or equivalent material was used for the aforementioned 0.062 inch stainless steel separator plates. A problem, however, was that the 0.062 inch stainless steel separator plates required cleaning or scrubbing to remove debris after every use and periodically needed to be resurfaced to remove dents and scratches due to handling and use. Eventually, the plates had to be replaced.

During the late 1980's, the introduction of vacuum assisted presses permitted the use of lower pressures during the lamination cycle. The pressures used in vacuum assisted presses typically ranged from approximately 150 psi to 250 psi, as opposed to the 300 psi to 500 psi range used in the hydraulic steam driven or electric presses. With vacuum assisted presses, aluminum separator sheets ranging in thickness from 0.007 inches to 0.015 inches were tested and then used extensively. Test results published during that time indicated that thin aluminum separator plates far exceeded the performance of steel plates for laminating PCB panels. These thin aluminum separator sheets were discarded after the lamination process, thus eliminating the need for expensive steel plate cleaning and handling operations and the frequent and high capital investment needed to replace the steel plates. The alloy used for aluminum separator plates is typically 3000 series (e.g. 3003, 3004, 3105 or equivalent) with a H19 hardness designation, which is identical to the alloy used to make aluminum beverage cans. The process using thin aluminum separator sheets along with low pressure from vacuum assisted presses has worked well for typical 4 layer to 6 layer PCB's with circuit lines of approximately 0.008 inches in width and approximately 0.008 inches apart. A typical configuration 24 in a press opening is schematically shown in FIG. 2 where 0.062 inch stainless steel plates 16a, 16b were placed on the bottom and top of the stack, respectively, and a thin aluminum sheet 26 was used to separate each PCB panel. The rate of production in these vacuum assisted presses increased to about 10–14 PCB panels per typical 1½ inch press opening compared to the 6 to 8 PCB panels achieved using 0.062 inch stainless steel sheets between the books as shown in FIG. 1.

Technological advancements, however, have driven a need for PCBs having more and denser circuitry. This means that circuits must have finer lines (less than 0.006 inches wide) and closer spacing between circuit lines (less than 0.006 inches). Denser surfaces on a PCB permit a higher quantity of electrical components to be mounted thereon, thus enabling faster information processing and greater miniaturization of electronic hardware. These greater technological demands have made the surface quality of the laminated circuit board panels even more critical. Problems such as surface roughness and image transfer that also previously existed, have now become critical issues that require resolution, as any minute bump on the surface of the aluminum sheet will be transferred to the top surface of the board necessitating scraping the board and reworking the PCB fabrication process.

To prevent and minimize scrap and rework due to image transfer and surface quality problems, almost every press configuration used today employs 0.062 inch stainless steel plates (usually T-304 or T-600 stainless steel) placed adjacent to the thin aluminum separator sheets in addition to on the top and bottom of the stack. Many press loads have at least three 0.062 stainless steel plates added to the lay-up, which then reduces the number of panels that can be laminated in each press cycle. Some of the lay-up configurations have both aluminum sheets and 0.062 inch stainless steel plates separating every panel in the press, with the aluminum separator sheets being discarded after the press cycle. This approach, however, has not completely cured the problem as it causes a decrease in the production rate of the press. Also, pits, dents and other surface imperfections due to the re-introduction of steel plates into the process are still causing scrap and rework of PCB panels. Moreover, many PCB fabricators have to purchase additional new 0.062 inch stainless steel plates and again install expensive plate cleaning and handling systems. Although the thin aluminum separator sheets are discarded after every press cycle, the steel plates must be cleaned before each use, adding additional operational steps and cost to the PCB fabrication process. To maintain production demands, fabricators must purchase additional vacuum presses, at a cost of approximately $250,000 to $1,000,000 per unit, to compensate for the loss of productivity due to the re-introduction of steel plates into the PCB fabrication process.

Today, fabricators are producing between 3 and 8 PCB panels on high technology dense boards with more quality problems and at a high cost. Dense state of the art PCB's now require 2 separators, an 0.062 inch stainless steel plate and a thin sheet of aluminum. This is an expensive step backward to the beginning of the evolution of the PCB fabrication process.

Furthermore, use of a thin piece of aluminum in a copper/aluminum or a thin piece of stainless steel in a copper/stainless steel laminate structure, which have also been used for manufacturing PCBs instead of using separate layers of copper and aluminum or copper and stainless steel, do not meet today's demanding requirements for high technology, dense PCB's. Copper/aluminum laminates suffer from a number of drawbacks which include susceptibility to print through and image transfer, misregistration, blistering, warpage and delamination. Copper/stainless steel laminates eliminate some of these problems but, like aluminum, tend to exhibit unacceptable surface roughness.

Off contact printing often results from image transfer. This generally inhibits the adhesion of dry film and the ability to expose a one to one image on panels. As a result, copper/aluminum laminates are typically limited to fabricating four to six layer PCB's. In addition, shims are often required between every PCB panel. The use of shims adds significant cost to PCB manufacture. The shims must go through a labor intensive cleaning process between each use. Shims are very expensive and many PCB manufacturers have had to set aside space in their manufacturing facilities for shim cleaning.

Misregistration results from too much movement in the inner layers. This causes drill breakage and renders the PCB useless. Drill breakage also results from misregistration in high technology PCBs where small holes which are less 13 mils and as small as 4 mils are typical.

Blistering results from the uneven coefficient of thermal expansion exhibited by aluminum. The uneven CTE creates more hot spots which cause blistering. This problem may not even show up for six months or more after fabrication and, therefore, may cause major system failures.

Surface roughness is also a problem with aluminum. The high surface roughness will cause off contact printing, broken drill bits, and loss of materials. The laminates are also susceptible to warpage which renders them useless. And, delamination has been observed using the laminates at low pressures.

Therefore, a need exists for a metal separator sheet that eliminates the need for use of conventional 0.062 stainless steel separator plates while solving the problems associated with aluminum and stainless steel separator sheets. The present invention meets the foregoing needs, as well as others, and overcomes the deficiencies found with conventional layup techniques.

BRIEF SUMMARY OF THE INVENTION

The deficiencies inherent in conventional PCB laminates and lamination processes are overcome by the separator sheet of the present invention which generally comprises a steel alloy material having a corrosion resistant coating and unique metallurgical properties. The steel alloy sheet can be used as a separate component, can be bundled with unattached copper foil, or can be optionally attached to a copper foil layer using, for example, adhesive materials in the manner described in used in U.S. Pat. No. 5,153,050 incorporated herein by reference, U.S. Pat. No. 5,120,590 incorporated herein by reference, U.S. Pat. No. 5,512,381 incorporated herein by reference.

When the present invention is used in a press for PCB fabrication, a copper foil layer is placed adjacent to either one or both sides of the steel layer. When heated and compressed onto the PCB panel, the copper adheres to and becomes a functional element of the final PCB. The steel alloy layer is subsequently removed and discarded. Use of the steel alloy layer of the present invention eliminates and/or reduces the need for conventional 0.062 stainless steel plates in the press lay-up and yields superior results over conventional thin aluminum, thin stainless steel and other conventional thin metal separator plates. As a result, the surface quality of the PCB is improved, image transfer is reduced and a flatter, less wavy PCB is produced without the cost of using separate 0.062 stainless steel separator plates. Furthermore, the similarity in the coefficients of thermal expansion (CTE) between the steel alloy of the present invention and copper allows the PCB's produced to be flatter, thus providing for a better registration of the foil layer to the substrate layer of the sheet laminate.

Additional information regarding sheet laminate fabrication technology and processes for manufacturing PCB's can be found in U.S. Pat. Nos. 4,875,283, 5,120,590, 5,512,381 and 5,153,050, each of which is incorporated herein by reference.

Use of a steel alloy separator sheet in accordance with the present invention provides for superior performance over copper/aluminum, copper/copper, and other known copper/metal laminate structures. For example, with the steel alloy of the present invention it is possible to manufacture PCBs having up to eighteen layers without the need to use shims. Because the steel alloy separator sheet of the present invention does not exhibit the image transfer problems associated with commonly used aluminum/copper and copper/copper laminates, the invention also allows more PCBs per book as compared to conventional laminates thereby facilitating increased production. In addition, the invention allows PCBs to be run at higher pressures, thereby providing a flatter and more usable PCB area. Furthermore, the need for conventional 0.062 stainless steel separator plates is eliminated, with a resulting reducing in material and facility cost. Also, the present invention exhibits a more stable heat rise than aluminum, thereby reducing the possibility of misregistration and drill breakage. Blistering and warpage are also reduced because the CTE of the present invention is similar to that of copper. And, the smooth surface of the present invention promotes the fabrication of high density PCBs. Also, delamination problems associated with aluminum/copper and copper/copper laminate structures are eliminated.

An object of the invention is to provide a separator sheet for use in a press lay-up between PCB layers, that eliminates the need to use both an 0.062 inch stainless steel and an aluminum separator sheet in PCB fabrication.

Another object of the invention is to eliminate the need for conventional aluminum separator sheets and their associated problems.

Another object of the invention is to eliminate the need for conventional 0.062 inch stainless steel plates and their associated problems.

Another object of the invention is to eliminate the need for using adhesives between the functional layer and the separator layer of PCB laminate structures.

Another object of the invention is to reduce the amount of waste in PCB manufacturing.

Another object of the invention is to eliminate the surface quality and image transfer problems associated with aluminum separator sheets.

Another object of the invention is to eliminate the need for constant scrubbing and cleaning of conventional 0.062 inch stainless steel separator plates.

Another object of the invention is to reduce and/or eliminate image transfer from the substrate layer onto the foil layer during PCB fabrication.

Another object of the invention is to provide a separator sheet, for use in a press lay-up between PCB layers, that results in flatter, less wavy PCB panels.

Another object of the invention is to provide a separator sheet for use in a press lay-up between PCB layers that has a CTE less than or equal to the CTE of copper.

Still another object of the invention is to provide a separator sheet, for use in a press lay-up between PCB layers, that maximizes the number of PCB panels that can be produced for a given press opening.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Figure 1:
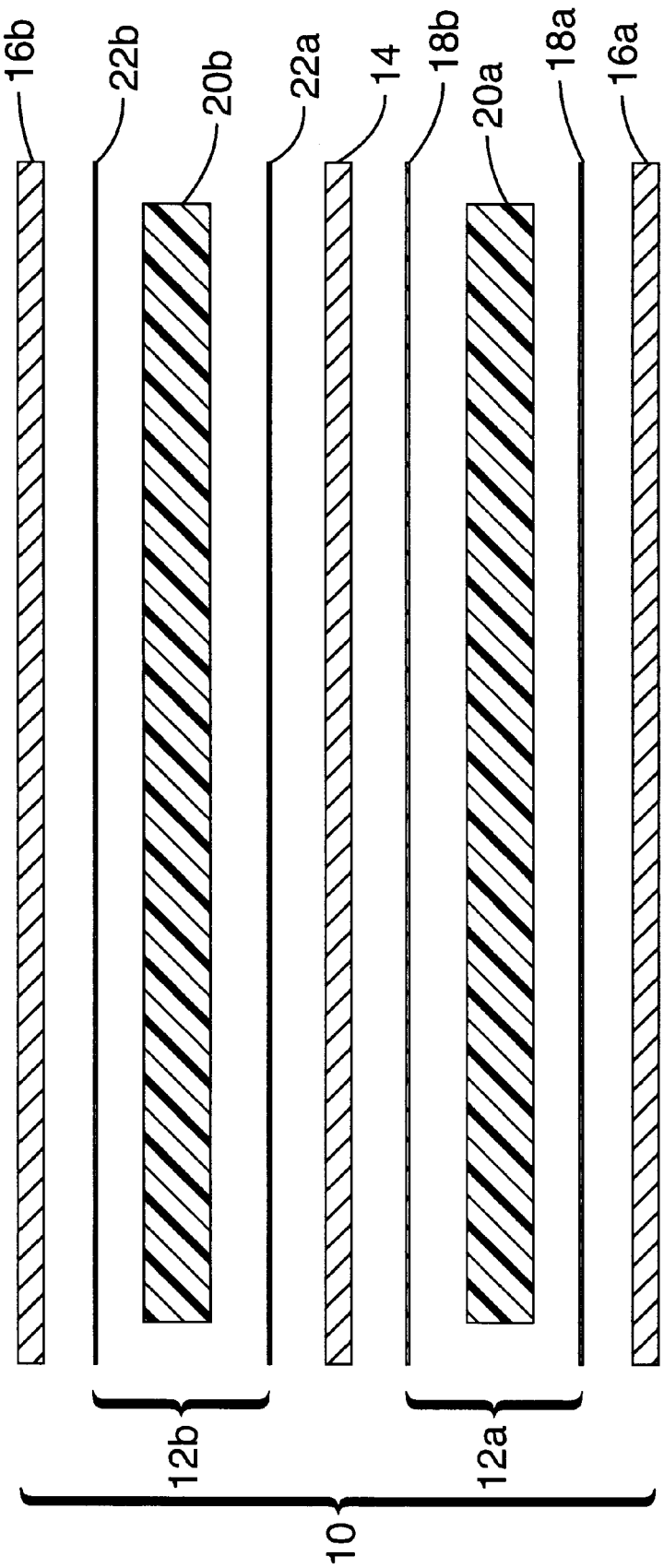
FIG. 1 is an exploded schematic view in cross-section of a conventional multilayer layup of two printed circuit boards prior to laminating, where an 0.062 inch stainless steel separator plate is placed between the boards.
Figure 2:
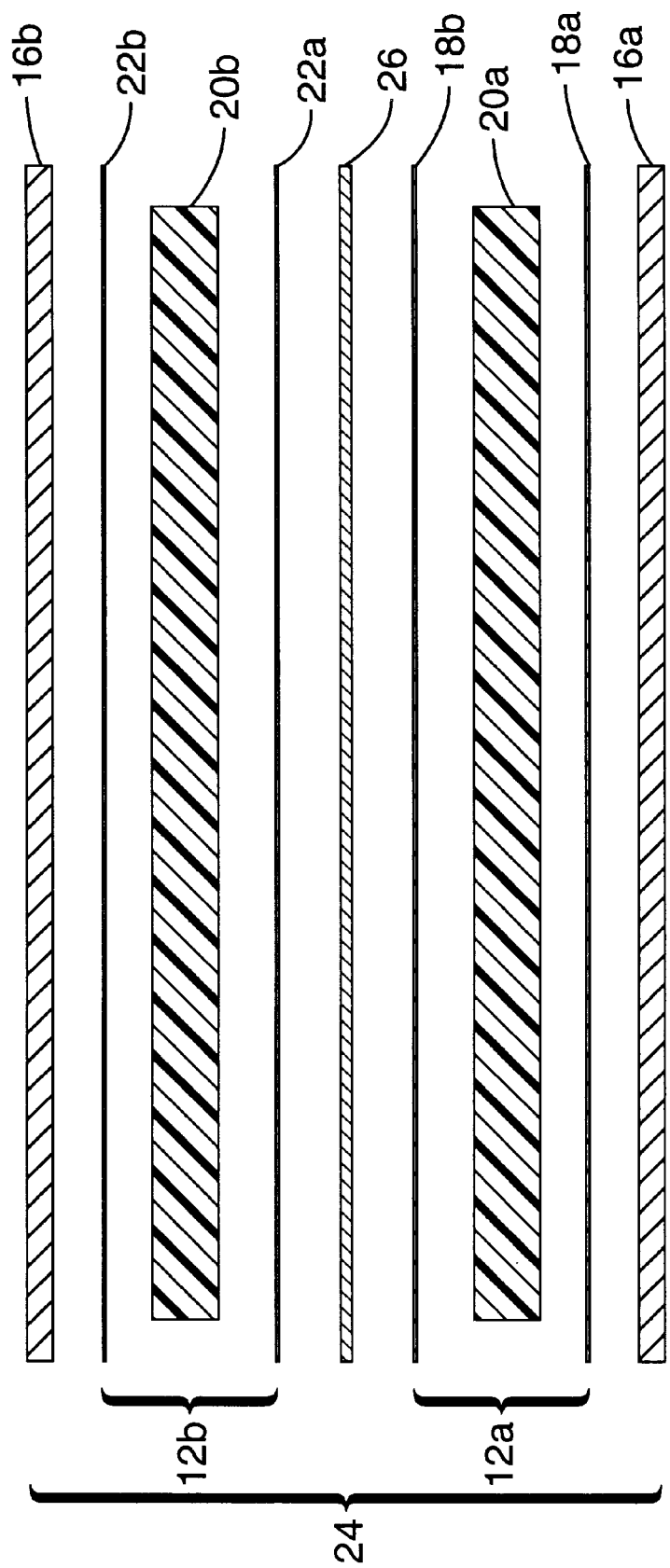
FIG. 2 is an exploded schematic view in cross-section of a conventional multilayer layup of two printed circuit boards prior to laminating, where an aluminum separator plate is placed between the boards.
Figure 3:
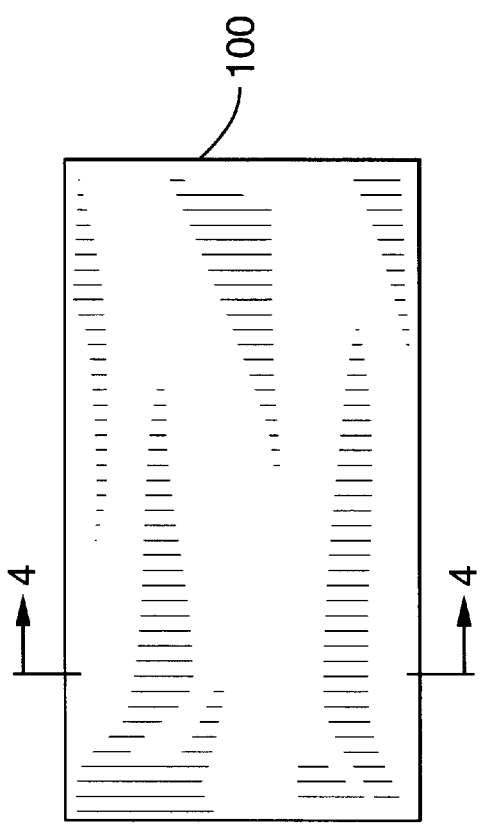
FIG. 3 is a schematic plan view of a steel alloy separator sheet in accordance with the present invention.
Figure 4:
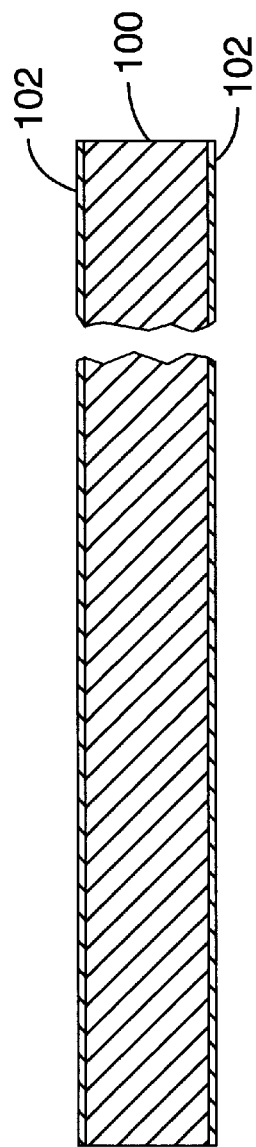
FIG. 4 is a cross-sectional view of the steel alloy separator sheet shown in FIG. 3 taken through line 4—4.
Figure 5:
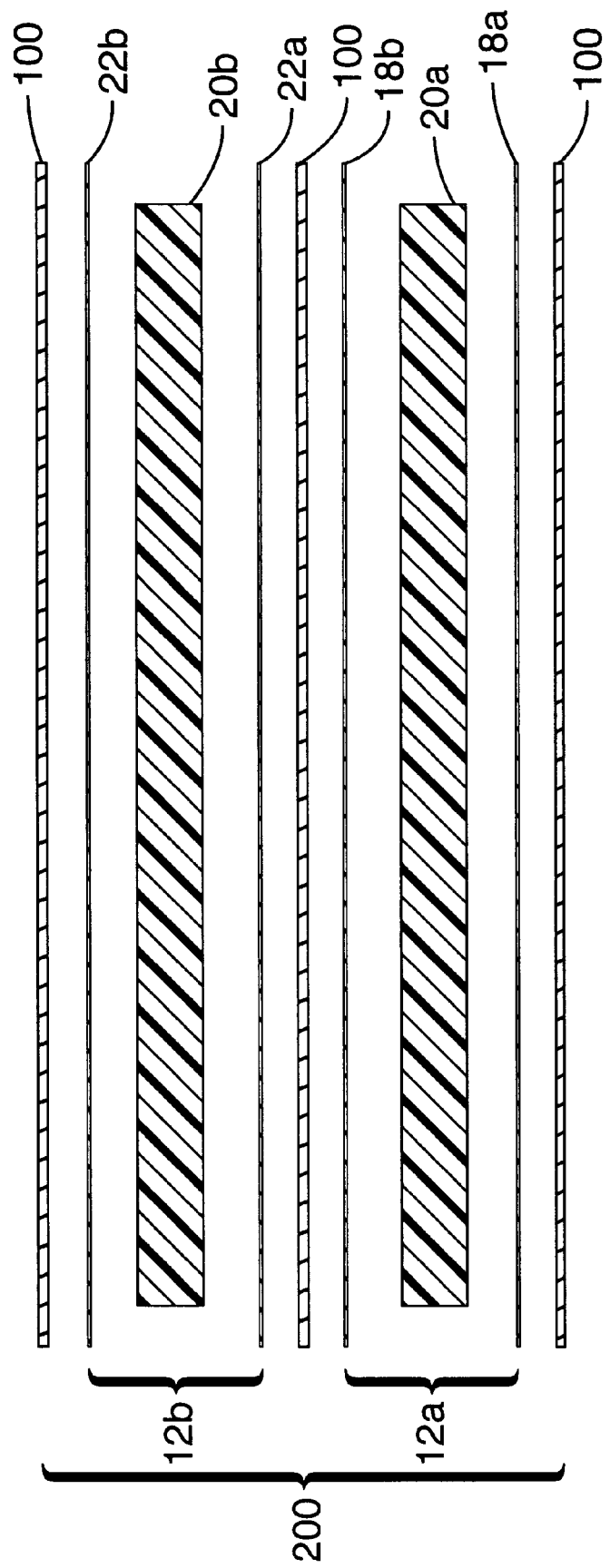
FIG. 5 is an exploded schematic view in cross-section of a multilayer layup of two printed circuit boards prior to laminating, employing steel alloy separator plates shown in FIG. 3 and FIG. 4.

Referring to FIG. 3 through FIG. 5, where like reference numbers denote like parts, as well as the following technical description, the present invention comprises a thin sheet of steel alloy 100 having the properties described herein that can be used as a separator sheet in a multilayer layup configuration 200 as schematically shown in FIG. 5. In use in the press, a copper foil layer can be placed adjacent to either or both sides of steel alloy sheet 100 as shown. Use of a steel alloy separator sheet in accordance with the present invention has been found to be superior to the commonly used 0.010 inch to 0.015 inch 3004 aluminum substrate for reducing image transfer and improving surface quality of the PCB, while also significantly improving productivity of PCB panels. Steel alloy sheet 100 of the present invention is designed for use in both traditional low pressure vacuum presses that operate in the range between approximately 150 psi and 250 psi, as well as high pressure presses up to 500 psi, which is well beyond the capability of aluminum.

Nickel or zinc-nickel plated 1008 low carbon steel has been determined to be ideal for meeting the objectives of the invention, although 1001 low carbon steel should also be suitable. The thickness of steel alloy sheet 100 can range from approximately 0.002 inches and 0.025 inches, although the preferable thickness range is between approximately 0.005 inches and 0.015 inches. Steel alloy sheet 100 can be supplied separately or bundled with a sheet of copper foil adjacent to either one or both sides of steel alloy sheet 100. If desired, sheets of copper foil and steel alloy sheet 100 can be laminated. If used, the copper foil layers preferably have a thickness ranging from approximately 0.00025 inches to approximately 0.005 inches.

Greater productivity is accomplished, while still meeting the other objectives of the invention, through use of a steel alloy sheet 100 that is approximately 0.008 inches thick and this thickness represents the preferred embodiment of the invention. The use of a steel alloy sheet approximately 0.008 inches thick eliminates the need or reduces the number of steel plates required in a press lay-up, resulting in a greater number of PCB panels capable of being placed into the press for a given lamination process. The "kiss cycle" during the lamination process, which is a prerequisite for the successful use of aluminum substrates, can also eliminated as a result of the use of a steel alloy sheet in accordance with the invention, thereby reducing the overall production time. The function of the "kiss cycle" is to soften or melt the epoxy before full pressure is applied. Fully liquefied epoxy flows away from the high pressure area into regions between circuits to minimize print through.

For illustrative purposes, the metallurgical and other characteristics of the preferred steel alloy used in the present invention are compared with aluminum in Table 1.

It will be appreciated that the surface of the PCB laminate that is produced is only as smooth as the material that is pressed against it. The surface quality of the PCB laminated with metal substrates is improved significantly by employing a steel layer having a surface finish of no greater than approximately 12 RMS. In comparison, aluminum has a surface finish around 18 RMS to 25 RMS. The issue of surface finish is critical especially when miniaturization is an objective, because the fewer imperfections that exist on the surface of the PCB when dense electrical paths are etched thereon, the more reliable the final PCB product. The steel alloy 100 of the present invention also has a low propensity to scratch, pit or dent because it is many times harder than other metals, such as aluminum. Therefore, a PCB laminated using a steel alloy separator sheet according to the invention will have less likelihood of surface imperfections.

Another the advantage provided by the steel alloy sheet 100 of the present invention lies in the additional hardness steel offers, along with greater rigidity, which significantly reduces image transfer onto the copper foil and ultimately, onto the finished PCB. For purposes of the present invention, a Knoop hardness of approximately 200 for the steel alloy of the invention provides satisfactory results at the desired thickness. A PCB laminated with such a steel alloy is also less wavy as compared to a PCB laminated with an aluminum substrate. It will be appreciated that harder steel is also satisfactory and contemplated within the scope of the present invention. For example, at the specified thicknesses, it is possible to obtain steel from suppliers with Knoop hardness ratings as high as approximately 850. Typically, though, the harder steels this thin are not easily available in the industry. It will further be appreciated that softer steel substrate is acceptable provided that it is not too soft. For example, a steel alloy substrate having a Knoop hardness of approximately 150 should also provide satisfactory results. It will also be appreciated, that the steel alloy of the present invention should be harder than either aluminum or copper to achieve the desired results described herein.

Preferably the steel alloy is plated with nickel or nickel-zinc 102 to provide corrosion resistance, although other common resistant coats, including polymers or electrolyzed aluminum (chrome), could be used. Lead, however, would not be an appropriate material since it is very soft and will bond to the copper foil layer during when heated. An additional surprising characteristic results from nickel plating steel alloy 100; namely, the hardness increases as it gets hotter. For example, the hardness of a nickel plated steel alloy increases by approximately 20% as the steel is heated to the curing temperature of 350° F. The optimum thickness of the nickel plating 102 is typically between approximately 20 μinches and approximately 50 μinches.

The greater rigidity provided by the steel alloy of the present invention also provides better support for the copper foil layers and practically eliminates the bellows-effect associated with aluminum substrates. Because of low rigidity, an aluminum substrate flexes easily and, when flexed, the aluminum substrate momentarily separates from the copper foil layer thereby creating a suction that draws dust and debris into the resultant gaps; that is, a bellows effect occurs. As a result of dust and debris entering the gaps, dent and epoxy spots appear on the finished PCB surface. This does not occur with the steel alloy of the present invention.

Significantly, the atomic crystal lattice patterns for aluminum and nickel plated steel are very different. The atoms in aluminum are arranged in a face centered cubic (FCC) pattern. The atoms in steel, however, are arranged in a body centered cubic (BCC) pattern. The nickel plating on the steel substrate is amorphous with no definite microstructure. This material is not a wrought product and is created by an electrical plating process. These crystal lattice patterns significantly influence the physical and mechanical properties of each material and explain why they present different characteristics in the same heated environment.

The heat transfer characteristics of steel provide a consistent and uniform heat rise with little variability. It is this uniformity in heat rise that reduces PCB panel thickness variations and provides a more consistent lamination quality with the present invention. The steel should have a CTE less than that of copper (e.g. less than approximately 9.8 μinches/° F.) so as to allow the copper foil layer to proportionally register with the steel alloy layer. During the thermal expansion process, the copper foil will move more than the steel alloy layer, so a steel alloy having a CTE equal to or less than copper would optimize registration between the two substances. Steel alloy 100 preferably has a coefficient of thermal expansion ranging between approximately 6.5 μinches/° F. and approximately 7.5 μinches/° F. Copper expands to approximately 50% as compared to expansion of aluminum while steel expands to approximately 90% as compared to aluminum. In direct comparison, the CTE of aluminum is 84% greater than that of steel. This means that a 24-inch wide unrestrained sheet of aluminum heated from room temperature (70° F.) to curing temperature will have its width increased by approximately 0.090 inches. A steel alloy sheet according to the present invention of identical proportion will have a width increase of approximately 0.049 inches and copper will have a width increase of approximately 0.066 inches. It can be clearly seen that not only are the dimensional differences between copper and steel less than the dimensional difference between aluminum and copper, the steel expands overall less than the copper which has been determined to be preferable. As a result, the PCB's produced using a steel alloy according to the present invention are flatter and more uniform as compared with those produced using aluminum substrates.

The primary material for PCB panels is woven fiberglass which is pre-pregnated (pre-preg) with a viscous thermosetting resin. Copper foil is transferred onto each face of the pre-preg in the press during lamination. During lamination, the woven fiberglass and resin pre-preg are heated and become a viscous liquid, free to expand along with the metals in the stack. Therefore, no significant stresses are induced into these composite materials by thermal expansion during heat up for curing. Since copper foil used in PCB manufacturing is very thin compared to steel alloy sheet 100, frictional forces will restrain movement of the copper foil during heating. The copper will therefore yield as the substrate material expands. If the substrate material is aluminum, the copper foil layer will be stretched 0.024 inches over the width of a twenty-four inch circuit board heated to the curing temperature, and uneven localized loading will cause the foil layer to be stretched non-uniformly, more in some areas than others, resulting in a "rippling" or "wavy" effect in the copper foil layer. On the other hand, if the material is steel according to the invention herein, the copper foil will not be stretched during heating to the curing temperature, and thus no uneven loading will occur on the copper foil layer and also blister causing strains in the copper foil is reduced.

Accordingly, it will be seen that this invention provides a metal separator sheet that is superior in its characteristics than conventional metal separators. Although the description above contains many specificities, these should not be construed as limiting the scope of the invention but as merely providing illustrations of some of the presently preferred embodiments of this invention. Thus the scope of this invention should be determined by the appended claims and their legal equivalents.

TABLE 1

|  | 1008 CS STEEL | 3004 H-19 ALUMINUM |
| --- | --- | --- |
| Composition | Iron and carbon | Aluminum with traces of magnesium and manganese. |
| Hardness (Knoop) | 199–220 | 60–70 |
| Density (lb/in$^3$) | 0.290 | 0.098 |
| CTE (inches/° F.) | 7.2 | 13.9 |
| Yield Strength (ln/in$^2$) | 133,000 | 41,000 |
| Tensile Strength (lb/in$^2$) | 140,000 | 43,000 |
| Modulus of Elasticity (lb/in$^2$) | 29,000,000 | 10,200,000 |
| Roughness (RMS) | <12 | 18–25 |

What is claimed is:

1. A separator sheet for use in manufacturing printed circuit boards, comprising a carbon steel substrate, said substrate having a Knoop hardness between approximately 150 and approximately 850, said substrate having a surface finish of less than approximately 12 RMS.

2. A separator sheet as recited in claim 1, wherein said substrate has a thickness between approximately 0.002 and approximately 0.025 inches.

3. A separator sheet as recited in claim 1, wherein said substrate has a coefficient of thermal expansion less than approximately 9.8 μinches per ° F.

4. A separator sheet for use in manufacturing printed circuit boards, comprising a carbon steel substrate having a coefficient of thermal expansion less than approximately 9.8 μinches per ° F. and a surface finish of less than approximately 12 RMS.

5. A separator sheet as recited in claim 4, wherein said substrate has a thickness between approximately 0.002 and approximately 0.025 inches.

6. A separator sheet as recited in claim 4, wherein said substrate layer has a Knoop hardness between approximately 150 and approximately 850.

7. A separator sheet for use in manufacturing printed circuit boards, comprising a carbon steel substrate having a coefficient of thermal expansion less than approximately 9.8 μinches per ° F., a Knoop hardness between approximately 150 and approximately 850, and a surface finish of less than approximately 12 RMS.

8. A separator sheet as recited in claim 7, wherein said substrate has a thickness between approximately 0.002 and approximately 0.025 inches.

9. A separator sheet for use in manufacturing printed circuit boards, comprising a carbon steel substrate having a coefficient of thermal expansion less than approximately 9.8 μinches per ° F., a Knoop hardness between approximately 150 and approximately 850, a surface finish of less than approximately 12 RMS, and a thickness between approximately 0.002 and approximately 0.025 inches.

* * * * *